United States Patent [19]

Nam

[11] Patent Number: 5,260,591
[45] Date of Patent: Nov. 9, 1993

[54] SOLID-STATE IMAGE SENSOR FOR TEMPORARILY FIXING A PICTURE ON A VIDEO SCREEN

[75] Inventor: Jung-Hyun Nam, Seoul, Rep. of Korea

[73] Assignee: SamSung Electronics Co., Ltd., Suwon, Rep. of Korea

[21] Appl. No.: 515,701

[22] Filed: Apr. 27, 1990

[30] Foreign Application Priority Data

Mar. 19, 1990 [KR] Rep. of Korea ............... 1990-3651

[51] Int. Cl.$^5$ ............... H01L 29/78; H01L 27/14; H01L 31/00
[52] U.S. Cl. .................. 257/238; 257/232; 257/233; 257/236; 377/59; 377/60
[58] Field of Search ............ 357/24 LR; 377/59, 60; 257/232, 233, 236, 238

[56] References Cited

U.S. PATENT DOCUMENTS

| | | | |
|---|---|---|---|
| 4,007,446 | 2/1977 | Elmer et al. | 377/59 |
| 4,490,744 | 12/1984 | Levine | 357/24 LR |
| 4,689,687 | 8/1987 | Koike et al. | 357/24 LR |
| 4,811,371 | 3/1989 | Tower | 377/60 |
| 4,856,033 | 8/1989 | Hirota | 357/24 LR |
| 4,974,240 | 11/1990 | Suzuki | 377/60 |

FOREIGN PATENT DOCUMENTS 59-11680  1/1984  Japan .................. 377/60

*Primary Examiner*—Andrew J. James
*Assistant Examiner*—Ngan Van Ngo
*Attorney, Agent, or Firm*—Robert E. Bushnell

[57] ABSTRACT

There is disclosed a solid-state image sensor comprising: photo-detecting devices arranged in a matrix structure for receiving external light signals; vertical charge transfer device interposed between the columns of said photo-detecting device for vertically transferring the charges produced from said photo-detecting device according to external control signal; first horizontal charge transfer device for horizontally transferring the charges coming out of said vertical charge transfer device according to external control signal; output control device for controlling the charges flowing from said first horizontal charge transfer device to said output device; second horizontal charge transfer device for transferring the output charges of said first horizontal charge transfer device controlled by said output control device to said vertical charge transfer device according to external control signal; and a feedback line for connecting the output of said first horizontal charge transfer device to the input of said second horizontal charge transfer device, whereby a picture can be temporarily fixed on a video screen.

12 Claims, 3 Drawing Sheets

SOLID-STATE IMAGE SENSOR FOR TEMPORARILY FIXING A PICTURE ON A VIDEO SCREEN

BACKGROUND OF THE INVENTION

The present invention generally concerns a CCD (Charge Coupled Device) and in particular an CCD image sensor for temporarily fixing a picture on a video screen.

The CCD is a kind of charge transfer device that is a dynamic element for transferring charges through a given channel under the control of the clock pulses.

Transferring in series the charges injected by input diodes from one end to the other end, the CCD is used as a shift register in a memory device, as well as serving a variety of logical functions, signal processing, image processig, etc. In image processing, the CCD is semiconductor device arrayed so that a flux of charges is formed in proportion to the intensity of light and transferred to a detecting device to read the data. To this end, interline transfer type CCD (IT-CCD) is used.

Referring to FIG. 1A for illustrating the structure of picture elements of the IT-CCD, there are disclosed a photo diode region 20 for producing charges in response to the external light, vertical CCD region 22, and transfer gate region 21 for transferring the charges to the CCD. In the drawing, the direction of the charge transferring in the vertical CCD region 22 is coming out perpendicularly to the cross section of the structure. As shown in the drawing, in an n-type substrate 10 is formed p-type well 11, where there are formed a region 12 for inducing n+ charges in the photo diode region 20, a region 14 for transferring the induced charges to the vertical CCD region 22, n-channel region 13 of the vertical CCD region 22, and a channel stopper 15 of p+ type. Further, in oxide film over the substrate 17 is formed a polysilicon gate 16 to overlap the transfer gate region 21 and the CCD region 22.

Thus, the charges induced by light in the n+ region 12 of the photo diode region 20 are transferred through the region 14 of the transfer gate region 21 to n-channel region 13 of the vertical CCD region 22 according to the control signal applied to the polysilicon gate 16, finally transferred through the vertically defined path of the vertical CCD region 22.

Referring to FIG. 1B for illustrating the conventional IT-CCD type solid-state image sensor including the picture elements as shown in FIG. 1A, there is disclosed a plurality of photo diodes 20 arranged in a matrix structure, between which columns is arranged the vertical channel 22 to vertically transfer the charges under the control of vertical clock pulses $\phi_{V1}$, $\phi_{V2}$, $\phi_{V3}$, $\phi_{V4}$ applied to the polysilicon gate. Between the photo diodes 20 and the vertical channel 22 is positioned the transfer gates 21. An horizontal CCD channel 23 horizontally transfers the charges coming out of the vertical CCD channel 22 to an output buffer 24 under the control of horizontal clock pulses $\phi_{H1}$, $\phi_{H2}$.

The transfer gate 21 is positioned under the polysilicon gate 16 of the vertical CCD channel 22 to form the channel region 14 (Refer to FIG. 1A) for transferring the charges formed in the photo diodes to the vertical CCD channel 22, which transfer gate 21 serves a MOS transistor operated by the polysilicon gate.

Referring to FIG. 1B, the vertical clock pulses $\phi_{V1}$, $\phi_{V2}$, $\phi_{V3}$, $\phi_{V4}$ and horizontal clock pulses $\phi_{H1}$, $\phi_{H2}$ are the control signals respectively applied to the polysilicon gates of the vertical and horizontal CCD channels 22 and 23 via the charge transfer directions.

In such a IT-CCD solid-state image sensor, the charges formed by light in the photo diodes 20 are transferred to the vertical CCD channel 22 via the transfer gate 21 positioned under the polysilicon gate having the vertical clock pulses applied. The vertical CCD channel 22 vertically transfers the charges to the horizontal CCD channel 23 according to the vertical clock pulses, while the horizontal CCD channel horizontally transfers the charges to output buffer 24 under the control of the horizontal clock pulses.

Conventionally, in order to temporarily fix a desired one of the moving pictures displayed on the screen of a CRT by employing such a solid-state image sensor is used a separate memory device external to the sensor through an A/D and D/A (Analog-to-Digital/Digital-to-Analog) converter, or otherwise the content recorded on a magnetic tape in a VTR is repeatedly reproduced. However, such methods require an externally separate equipment to fix a picture of high resolution, so that it is difficult to make them available.

SUMMARY OF THE INVENTION

It is an object of the present invention to provide a solid-state image sensor which can temporarily fix a desired one of the moving pictures displayed on the screen of a CRT without using a separate external equipment.

It is another object of the present invention to provide a simple method for temporarily fixing a desired one of the moving pictures displayed on the screen of a CRT by using a solid-state image sensor.

According to an aspect of the present invention, a solid-state image sensor includes: a photo-detecting device arranged in a matrix structure for receiving external light signals; a vertical charge transfer device interposed between the columns of the photo-detecting device for vertically transferring the charges produced from the photo-detecting device according to external control signal; a charge connecting device interposed between the photo-detecting device and vertical charge transfer device for vertically transferring the charges produced from the photo-detecting device according to external control signal; a charge connecting device interposed between the photo-detecting device and vertical charge transfer device for connecting the charges produced from the photo-detecting device to the vertical charge transfer device according to external control signal; a first horizontal charge transfer device for horizontally transferring the charges coming out of the vertical charge transfer device according to external control signal; an output buffer for converting into a voltage form and amplifying the charges coming out of the first horizontal charge transfer device; an output cotrol MOS for controlling the charges flowing from the first horizontal charge transfer device to the output buffer; second horizontal charge transfer device for transferring the output charges of the first horizontal charge transfer device controlled by the output cotrol MOS to the vertical charge transfer device according to external control signal; and feedback line for connecting the output of the first horizontal charge transfer device with the input of the second horizontal charge transfer device, whereby a picture can be temporarily fixed on a video screen.

The vertically and horizontally transferred charges are finally detected to continuously be fed back to the vertical charge transfer device for a given time according to external control signal.

The present invention will now be described more specifically with reference to the drawings attached only by way of example.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF PREFERRED EMBODIMENT

Figure 2:
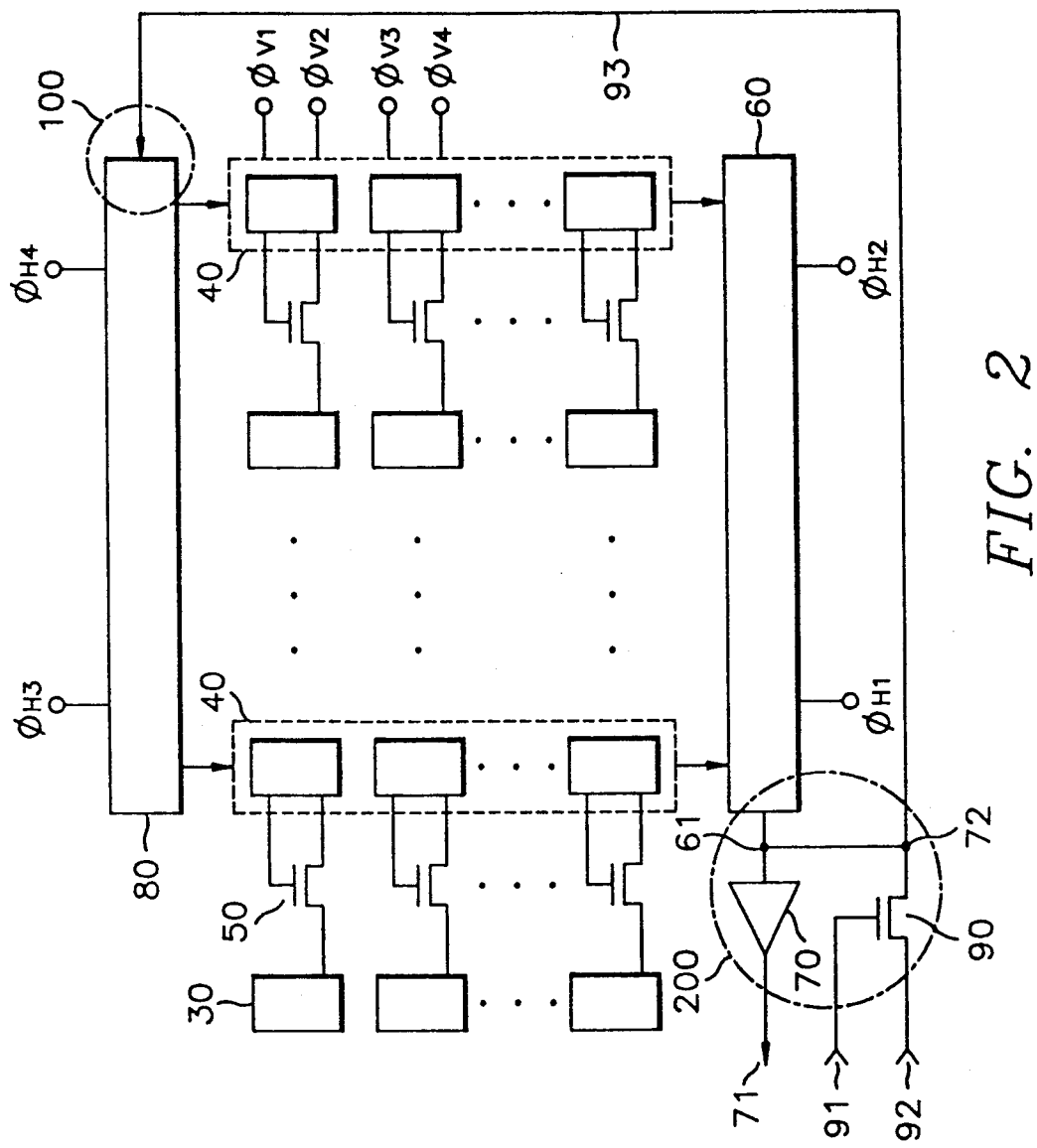
FIG. 2 illustrates the structure of the inventive structure.

Referring to FIG. 2 for illustrating the structure of a CCD type solid state image sensor according to the present invention, a plurality of photo diodes to constitute a photo-detecting device 30 are arranged in rows and columns for receiving external light signals. Vertical charge transfer device 40 interposed between the columns of the photo-detecting device 30 constitute a vertical CCD channel for vertically transferring the charges produced from the photo-detecting device 30 according to the control of vertical transfer clock pulses $\phi_{V1}, \phi_{V2}, \phi_{V3}, \phi_{V4}$.

Charge connecting device 50 includes the channel regions of transistors to transfer the charges produced from the photo-detecting device 30 to the vertical charge transfer device 40.

First horizontal charge transfer device 60 constitutes a horizontal CCD channel for horizontally transferring the charges coming out of the vertical charge transfer device 40 according to the control of first horizontal clock pulses $\phi_{H1}, \phi_{H2}$.

Output buffer 70 converts the output signal of the first horizontal charge transfer device 60 into a voltage form outputted to a signal detecting part 71.

Output control MOS 90 is connected to the junction 72 between the output buffer 70 and the first horizontal charge transfer device 60 and whose drain is connected to pull-down reset terminal 92. Feedback line 93 is connected to the junction 72.

Second horizontal charge transfer device 80 receives the signal fed back through the feedback line 93 to horizontally transfer it to the vertical charge transfer device 40 under the control of the second horizontal transfer clock pulses $\phi_{H3}, \phi_{H4}$.

Figure 1A:
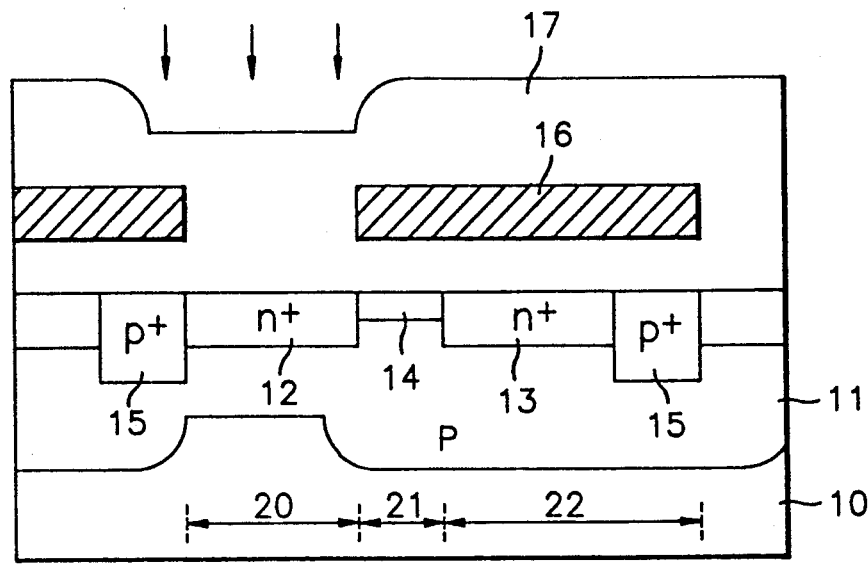
FIG. 1A is a cross sectional view of the structure of a picture element of an IT-CCD type solid state image sensor.
Figure 1B:
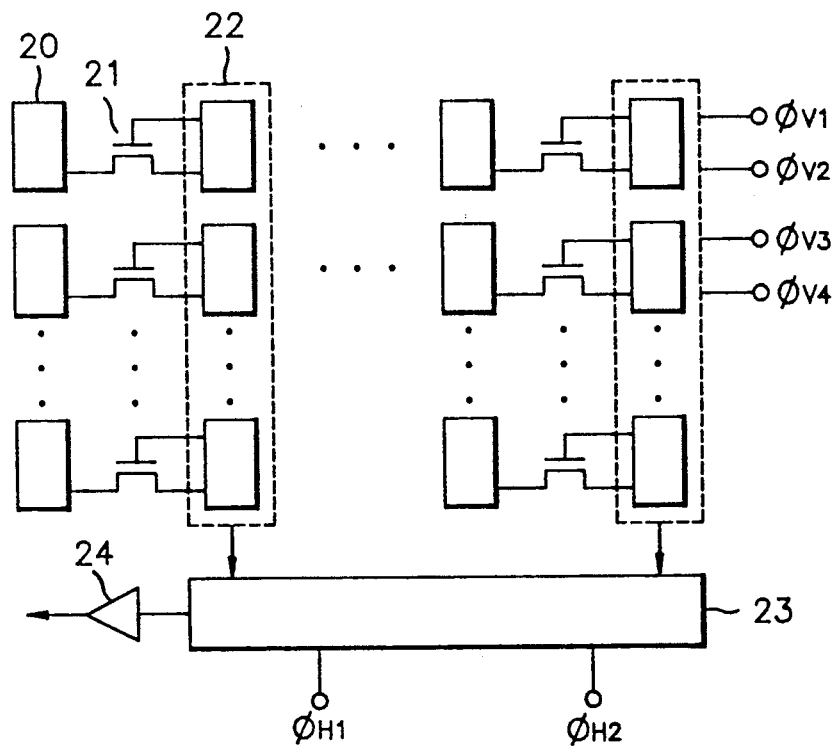
FIG. 1B illustrates the structure of a conventional IT-CCD type solid state image sensor.

The picture element herein includes the photo-detecting device 30, charge connecting device 50 and vertical charge transfer device 40, as shown in FIG. 1A.

The vertical transfer clock pulses $\phi_{V1}, \phi_{V2}, \phi_{V3}, \phi_{V4}$ and the first and second horizontal transfer clock pulses $\phi_{H1}, \phi_{H2}, \phi_{H3}, \phi_{H4}$ are respectively applied to the gates of the vertical charge transfer device 40 and the first and second horizontal charge transfer device 60 and 80 to control the vertical and horizontal transfer of the charges.

Referring FIG. 2, the portions 100 and 200 indicated by the dotted circle show both ends of the feedback line 93, through which the output signal of the first horizontal charge transfer device 60 is fed back to the second horizontal charge transfer device 80 to temporarily fix the desired one of the moving pictures displayed on the screen of a CRT. The portions 100 and 200 are shown in detail in FIG. 3.

Figure 3:
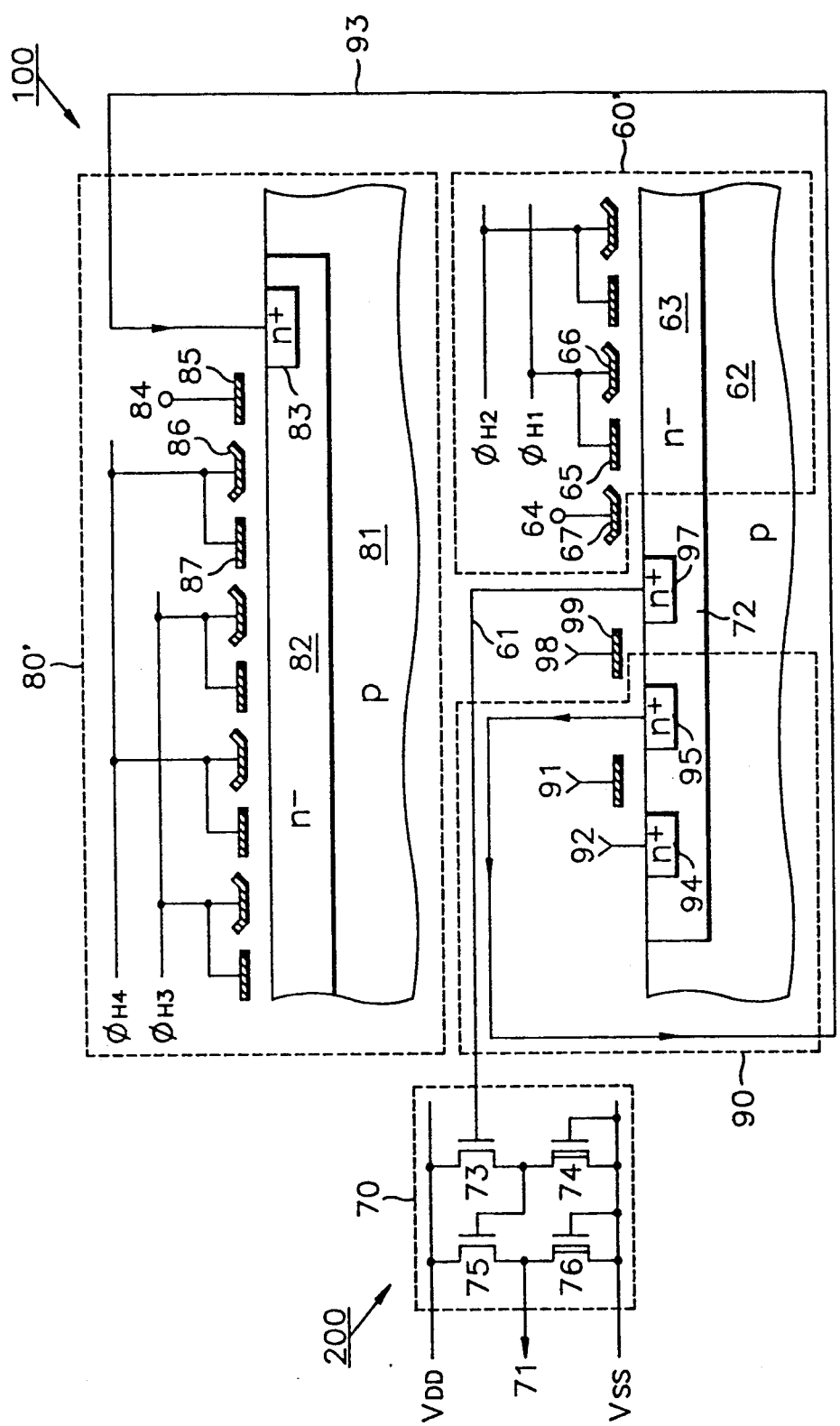
FIG. 3 is a detailed view of a portion of FIG. 2.

Referring FIG. 3, there is shown a cross sectional view of one and the same substrate on which there are formed the output terminal part 60' of the first horizontal charge transfer device 60 and the output control MOS 90.

In the output terminal of the first horizontal charge transfer device 60, multiple pairs of transfer gates 65 and 66 are arranged over n− well 63 formed in the p-type substrate 62, which pairs are alternately connected to the lines of the first horizontal clock pulses $\phi_{H1}, \phi_{H2}$. Output gate connected to output gating signal 64 is formed adjacent to the transfer gate positioned in the final end of the output terminal part 60'.

The output cotrol MOS 90 includes n-channel MOS transistor formed in n− well 63 of the p-type substrate 62, n+ diffusion region 97 connected through line 61 to output buffer 70, and reset gate 99 connected to feedback reset signal 98. The MOS transistor has the drain 94 connected to pull-down reset terminal 92, source 95 connected to feedback line 93, and gate 96 connected to feedback control signal 91. The n+ diffusion region is formed between the source 95 and the n− well region below the output gate 67. The reset gate 99 controls the channel for signal transfer between the source 95 and the n+ diffusion region 97. Here, the reset gate 99 and the channel region below it form the junction region 72 shown in FIG. 2 together with the n+ diffusion region 97.

The output buffer 70 is a conventional buffer circuit that includes NMOS transistors 73, 75 connected in series between power source voltage $V_{DD}$ and ground voltage $V_{SS}$, and depletion NMOS transistors 74, 76 that is normally turned-on. The output buffer is connected through the line 61 to the n+ diffusion region 97 to receive through the NMOS transistor 73 the signal transferred to the first horizontal charge transfer device 60, thus finally outputting signals to a signal detecting terminal 71 through the node formed between the transistors 75 and 76.

In the input terminal part 80' of the second horizontal charge transfer device 80 are formed n+ diffusion region 83 for receiving the signal fed back from the output control MOS 90, multiple transfer gates 86, 87 overlapping n− well 82 formed in p-type substrate 81, and input gate 85 connected to input gating signal 84 between the first transfer gate 86 and the n+ diffusion region 83. The n+ diffusion region 83 is formed in n− well 82 of p-type substrate 81, connected to the source 95 of the n-channel MOS transistor through feedback the line 93. The multiple pairs of the gates 86 and 87 are alternately connected to each of the lines of the second horizontal charge transfer clock pulses $\phi_{H3}, \phi_{H4}$.

Hereinbelow, the operation of the solid-state image sensor is specifically described with reference to FIGS. 2 and 3. In normal operation, the charges produced by the photo-detecting device 30 are transferred through the transfer device 50 to the vertical charge transfer device 40 to vertically transfer them to the first horizontal charge transfer device 60. Finally, the charges are converted into a voltage form, transferred to the signal detecting terminal 71. At this time, when the output gating signal 64, feedback reset signal 98 and feedback control signal 91 are all high state, the charges coming out of the first horizontal charge transfer device 60 flow through the drain 94 connected to the pull-down reset terminal, and therefore there is no feedback signal to the second horizontal charge transfer device 80. This normal operation is the same as that of the conventional IT-CCD type solid-state image sensor.

However, when the feedback signal 91 is low state in order to fix the desired one of the moving pictures displayed on the screen of a CRT, the channel is not formed between the drain 94 and source 95 of the NMOS transistor, so that the charges outputted from the first horizontal charge transfer device 60 are applied to the n+ diffusion region 83 of the second horizontal charge transfer device 80 via the source 95 and feedback line 93. At this time, the input gating signal 84 is enabled into high state, so that the second horizontal charge transfer device 80 transfers the charges via the vertical charge transfer device 40 and the first horizontal charge transfer device 60 to the channel region or junction 72 below the reset gate 99, where the charge transfer of the transfer device 50 is prohibited. Thus, when the feedback reset signal 91 continues to be low state, the feedback operation described as above is repeated, thereby executing the picture fixing function.

In this picture fixing operation, there is formed a closed independent loop by the first horizontal charge transfer device 60, the source of NMOS transistor, feedback line 93, second horizontal charge transfer device 80, and vertical charge transfer device 40, where the charges produced by the photo-detecting device 30 do not affect the vertical charge transfer device 40, so that the output buffer 70 repeats to detect the charges stored into the vertical charge transfer device 40 to execute the picture fixing function.

In the present embodiment, although the present invention is applied to the IT type solid-state image sensor, it will be noted that the present invention may be applied to other type of solid-state image sensors. Also other elements instead of the NMOS transistor may be employed for output control.

As described above, the present invention provides the device to feedback the output of the solid-state image sensor to temporarily fix the desired picture on the screen of a CRT. Moreover, the present invention provide the picture fixing function by device of a simple construction within the solid-state image sensor, which function is externally obtained in the conventional image sensor, so that the image processing apparatus employing the solid-state image sensor is simply structured, thereby increasing the reliability of the functions of the solid-state image sensor.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:
1. A solid-state image sensor comprising:
photo-detecting means arranged in a matrix structure, for receiving external light signals;
vertical charge transfer means interposed between the columns of said photo-detecting means, for vertically transferring charges produced from said photo-detecting means according to external control signal;
charge connecting means interposed between said photo-detecting means and vertical charge transfer means, for transferring the charges produced from said photo-detecting means according to external control signal;
first horizontal charge transfer means for horizontally transferring the charges coming out of said vertical charge transfer means according to external control signal;
output mean for converting into a voltage form and amplifying the charges coming out of said first horizontal charge transfer means;
output control means for controlling the charges flowing from said first horizontal charge transfer means to said output means;
second horizontal charge transfer means for transferring the output charges of said first horizontal charge transfer means controlled by said output control means to said vertical charge transfer means according to external control signal; and
feedback means for connecting the output of said first horizontal charge transfer means to the input of said second horizontal charge transfer means, whereby a picture can be temporarily fixed on a video screen.

2. A solid-state image sensor as claimed in claim 1, characterized by the external control signal applied to said first and second horizontal charge transfer means being clock pulses for horizontally transferring the input charges.

3. A solid-state image sensor as claimed in claim 1, characterized by the external control signal applied to said vertical charge transfer means being clock pulses for vertically transferring the input charges.

4. A solid state image sensor as claimed in claim 1 or 3, characterized by the external control signal applied to said charge connecting means being the external control signal applied to said vertical charge transfer means.

5. A solid-state image sensor as claimed in claim 1, characterized by said photo-detecting means being photo diodes.

6. A solid-state image sensor as claimed in claim 1, characterized in that said output control means comprises an insulating gate field effect transistor, of which gate is connected to external feedback control signal, of which one of the drain or source is connected to a pull-down reset terminal and the other is connected to the output of said first horizontal charge transfer means, the input of said output means and said feedback line.

7. A solid-state image sensor as claimed in claim 1, characterized in that the vertically and horizontally transferred charges are finally detected to continuously be fed back to said vertical charge transfer means for a given time interval according to external control signal.

8. A solid-state image sensor as claimed in claim 7, characterized by said finally detected charge signal maintaining a constant state while the external control signal is not changed.

9. A solid-state image sensor comprising:
photo-detecting means arranged in a matrix structure, for receiving external light signals;
vertical charge transfer means, interposed between the columns of said photo-detecting means, for vertically transferring the charges produced from said photo-detecting means according to external control signal;

horizontal charge transfer means, for horizontally transferring the charges coming out of said vertical charge transfer means according to external control signal;

output means for converting into a voltage form and amplifying the charges coming out of said horizontal charge transfer means;

output control means for controlling the charges flowing from said horizontal charge transfer means to said output means; and feedback line for connecting the output of said horizontal charge transfer means to the input of said vertical charge transfer means, whereby a picture can be temporarily fixed on a video screen.

10. A solid-state image sensor as claimed in claim 9, characterized by the external control signals applied to said vertical and horizontal charge transfer means being clock pulses for vertically and horizontally transferring the input charges.

11. A solid-state image sensor as claimed in claim 9, characterized by said photo-detecting means being photo diodes.

12. A solid-state image sensor as claimed in claim 9, characterized in that said output control means comprises:

an insulating gate field effect transistor, of which the gate is connected to external feedback control signal, of which one of the drain or source is connected to pull-down reset terminal and of which the other of said drain or source is connected to the output of said horizontal charge transfer means, the input of said output means and said feedback line.

* * * * *

UNITED STATES PATENT AND TRADEMARK OFFICE
CERTIFICATE OF CORRECTION

PATENT NO. : 5,260,591
DATED : November 9, 1993
INVENTOR(S) : Jung-Hyun Nam

It is certified that error appears in the above-indentified patent and that said Letters Patent is hereby corrected as shown below:

Column 1,

Line 18,    change "processig" to --processing--;

Line 37,    replace "film over the substrate 17", with --film 17 over the substrate 10--;

Column 2,

Line 58,    change "cotrol" to --control--;

Line 62,    change "cotrol" to --control--; and

Column 4,

Line 22,    change "cotrol" to --control--.

Signed and Sealed this

Fourth Day of October, 1994

Attest:

BRUCE LEHMAN

*Attesting Officer*        *Commissioner of Patents and Trademarks*